United States Patent
Seo et al.

(10) Patent No.: US 8,937,311 B2
(45) Date of Patent: Jan. 20, 2015

(54) THIN FILM TRANSISTOR, THIN FILM TRANSISTOR ARRAY SUBSTRATE AND METHOD OF FABRICATING THE SAME

(71) Applicant: LG Display Co., Ltd., Seoul (KR)

(72) Inventors: Hyun-Sik Seo, Goyang-si (KR); Bong-Chul Kim, Daegu-si (KR); Dae-Won Kim, Goyang-si (KR)

(73) Assignee: LG Display Co., Ltd., Seoul (KR)

(*) Notice: Subject to any disclaimer, the term of this patent is extended or adjusted under 35 U.S.C. 154(b) by 101 days.

(21) Appl. No.: 13/717,400

(22) Filed: Dec. 17, 2012

(65) Prior Publication Data

US 2013/0207110 A1 Aug. 15, 2013

(30) Foreign Application Priority Data

Feb. 15, 2012 (KR) .................. 10-2012-0015290

(51) Int. Cl.
| | |
|---|---|
| *H01L 29/04* | (2006.01) |
| *H01L 31/036* | (2006.01) |
| *H01L 31/0376* | (2006.01) |
| *H01L 31/20* | (2006.01) |
| *H01L 29/786* | (2006.01) |
| *H01L 29/66* | (2006.01) |
| *H01L 29/45* | (2006.01) |
| *H01L 29/49* | (2006.01) |

(52) U.S. Cl.
CPC ........ *H01L 29/786* (2013.01); *H01L 29/66742* (2013.01); *H01L 29/45* (2013.01); *H01L 29/4908* (2013.01); *H01L 29/78693* (2013.01); *H01L 29/66969* (2013.01)
USPC .......................................................... 257/57

(58) Field of Classification Search
CPC .................. H01L 29/66742; H01L 29/786
USPC .............. 438/158; 257/57, E29.117, E29.147
See application file for complete search history.

(56) References Cited

U.S. PATENT DOCUMENTS

| 8,664,658 B2* | 3/2014 | Yoneda ........................ 257/57 |
| 2008/0149930 A1* | 6/2008 | Lee et al. ........................ 257/59 |
| 2011/0309510 A1* | 12/2011 | Lee et al. ........................ 257/751 |

FOREIGN PATENT DOCUMENTS

| JP | 2008-028395 A | 2/2008 |
| JP | 2008-066678 A | 3/2008 |
| JP | 2010-062229 A | 3/2010 |
| JP | 2011-139049 A | 7/2011 |
| JP | 2011-258941 A | 12/2011 |

OTHER PUBLICATIONS

Japanese Patent Office, Office Action, Japanese Patent Application No. 2012-268197, Nov. 26, 2013, six pages.

* cited by examiner

*Primary Examiner* — David S Blum
(74) *Attorney, Agent, or Firm* — Fenwick & West LLP

(57) ABSTRACT

A method of fabricating a thin film transistor includes sequentially forming a first metal layer on a substrate and a second metal layer of copper on the first metal layer; performing a plasma process to form a copper nitride layer on the second metal layer; patterning the copper nitride layer, the second metal layer and the first metal layer to form a gate electrode; forming a first gate insulating layer of silicon nitride on the substrate including the gate electrode; forming a second gate insulating layer of silicon oxide on the first gate insulating layer; forming a semiconductor layer on the second gate insulating layer formed of an oxide semiconductor material; and forming a source electrode and a drain electrode on the semiconductor layer, the source electrode spaced apart from the drain electrode.

6 Claims, 5 Drawing Sheets

THIN FILM TRANSISTOR, THIN FILM TRANSISTOR ARRAY SUBSTRATE AND METHOD OF FABRICATING THE SAME

The present application claims the benefit of Korean Patent Application No. 10-2012-0015290 filed in the Republic of Korea on Feb. 15, 2012, which is hereby incorporated by reference herein in its entirety.

BACKGROUND OF THE INVENTION

1. Field of the Invention

The present invention generally relates to a thin film transistor (TFT) and a TFT array substrate, and more particularly to a TFT and a TFT array substrate using a copper signal line and a method of fabricating the same.

2. Discussion of the Related Art

A flat panel display device, for example, a plasma display panel (PDP) device, a liquid crystal display (LCD) device and an organic light emitting diode (OLED) device, is widely developed and used. Since the flat panel display device has advantages in thickness, weight and power consumption, it is used as a display device instead of the cathode ray tube (CRT).

To meet requirements for a flat panel display device having a large size and high resolution, a width of a signal line is desired to be decreased and a length of the signal line is desired to be increased, which causes line resistance to rapidly increase and incur a voltage drop.

To reduce the line resistance, a relative low resistance material, e.g., copper (Cu) and silver (Ag), is used for the signal line, e.g., a gate line. Particularly, a patterning process for Cu is easier than that for Ag, and a specific resistance, i.e., 2.1~2.3 µΩcm, of a Cu film is smaller than a specific resistance, i.e., 3.1 µΩcm, of an aluminum (Al) film, which is widely used as the signal line. In addition, the Cu layer has stronger resistance against a hillock problem than the Al layer. Accordingly, the Cu film is in the spotlight as a material for a signal line.

However, Cu has a bad adhesive property with glass. Accordingly, a peeling problem of a Cu line from a glass substrate may occur. In addition, since a size of Cu ion is small, the Cu ion is easily diffused through a silicon oxide film. Accordingly, in the instance of forming an insulating layer of silicon oxide on a Cu line, a Cu ion of the Cu line is diffused into the insulating layer such that an insulating property of the insulating layer is degraded.

Moreover, since Cu has high oxidization property, Cu is easily oxidized when being exposed to air. The Oxidized Cu increases resistance and stress of the Cu line such that electrical properties of the Cu line are degraded.

SUMMARY OF THE INVENTION

Accordingly, the present invention is directed to a thin film transistor, a method of fabricating the thin film transistor and a method of fabricating a flat panel display device that substantially obviate one or more of the problems due to limitations and disadvantages of the related art.

An object of the present invention is to provide an array substrate having improved properties.

Another object of the present invention is to provide a flat panel display device being capable of preventing a voltage drop problem by using a Cu layer, in particular, for the gate electrode.

Specifically, the present invention addresses the following objects.

First, there is a problem of peeling of the insulating layer made of SiO2 from the gate electrode including Cu. This can be caused by a poor adhesion characteristics between SiO2 and Cu. This problem causes the diffusion of the Cu ion into the SiO2, which degenerates the insulating characteristics. Second, there is a problem of another peeling of the gate electrode including Cu from the substrate. This problem is caused also by the poor adhesion characteristics between the Cu and the substrate that is made of, for example, glass, plastic, and so on. Third, it is necessary to improve the resistance of the gate electrode including Cu against the oxide and H2O. Because, the Cu is easily subjected to the oxidation.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a method of fabricating a thin film transistor comprises: sequentially forming a first metal layer on a substrate and a second metal layer of copper on the first metal layer; performing a plasma process to form a copper nitride layer on the second metal layer; patterning the copper nitride layer, the second metal layer and the first metal layer to form a gate electrode; forming a first gate insulating layer of silicon nitride on the substrate including the gate electrode; forming a second gate insulating layer of silicon oxide on the first gate insulating layer; forming a semiconductor layer on the second gate insulating layer formed of an oxide semiconductor material; and forming a source electrode and a drain electrode on the semiconductor layer, the source electrode spaced apart from the drain electrode.

In another aspect, a method of fabricating a thin film transistor (TFT) array substrate comprises: sequentially forming a first metal layer on a substrate and a second metal layer of copper on the first metal layer; performing a plasma process to form a copper nitride layer on the second metal layer; patterning the copper nitride layer, the second metal layer and the first metal layer to form a gate line and a gate electrode; forming a first gate insulating layer of silicon nitride on the substrate including the gate line and the gate electrode; forming a second gate insulating layer of silicon oxide on the first gate insulating layer; forming a semiconductor layer on the second gate insulating layer formed of an oxide semiconductor material; forming an etch-stopper on the semiconductor layer; forming a source electrode and a drain electrode on the semiconductor layer and a data line on the second gate insulating layer, the source electrode spaced apart from the drain electrode interposing the etch-stopper and coupled to the data line; and forming a pixel electrode coupled to the drain electrode.

In another aspect, a thin film transistor comprises: a gate electrode on a substrate, wherein the gate electrode includes a first layer formed of copper and a second layer formed of copper nitride on the first layer; a first gate insulating layer on the substrate including the gate electrode and formed of silicon nitride; a second gate insulating layer on the first gate insulating layer and formed of silicon oxide; a semiconductor layer formed of an oxide semiconductor material on the second gate insulating layer; an etch-stopper layer formed on the semiconductor layer; and a source electrode and a drain electrode formed on the etch-stopper layer and spaced apart from each other.

In another aspect, a thin film transistor (TFT) array substrate comprises: a gate electrode on a substrate, wherein the gate electrode includes a first layer formed of copper and a second layer formed of copper nitride on the first layer; a first gate insulating layer on the substrate including the gate electrode and formed of silicon nitride; a second gate insulating layer on the first gate insulating layer and formed of silicon oxide; a semiconductor layer formed of an oxide semiconductor material on the second gate insulating layer; an etch-stopper layer formed on the semiconductor layer; a source electrode and a drain electrode formed on the etch-stopper layer and spaced apart from each other; a gate line coupled to the gate electrode; a data line on the second gate insulating layer and coupled to the source electrode; and a pixel electrode coupled to the drain electrode.

It is to be understood that the following detailed description is intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF EMBODIMENTS

Reference will now be made in detail to the embodiments, examples of which are illustrated in the accompanying drawings.

Figure 1:
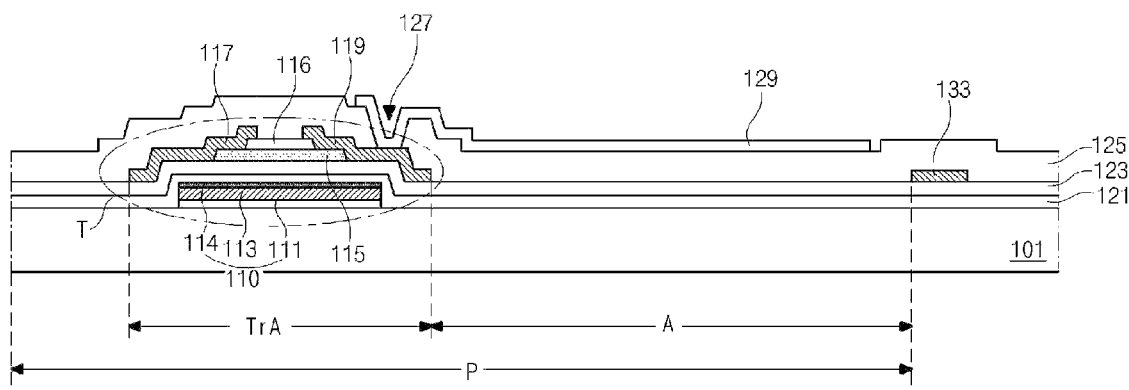
FIG. 1 is a cross-sectional view of an array substrate including a thin film transistor for a flat panel display device according to an embodiment of the present invention.

FIG. 1 is a cross-sectional view of an array substrate including a thin film transistor for a flat panel display device according to an embodiment of the present invention.

Referring to FIG. 1, an array substrate for a flat panel display device includes a gate line (not shown), a data line 133, a thin film transistor (TFT) T, a pixel electrode 129.

The gate line and the data line 133 cross each other to define a pixel region at a display region A. The TFT T is disposed at a crossing portion of the gate line and the data line 133. A region for the TFT T may be referred to as a switching region TrA. The pixel electrode 129 is disposed in the pixel region P.

The TFT T includes a gate electrode 110, a first gate insulating layer 121, a second gate insulating layer 123, an oxide semiconductor layer 115, a source electrode 117 and a drain electrode 119. The TFT T further includes an etch-stopper 116 for preventing for the oxide semiconductor layer 115 from being exposed to an etchant for patterning the source electrode 117 and the drain electrode 119.

The gate electrode 110 is connected to the gate line, and the source electrode 117 is connected to the data line 133. Namely, the TFT T is electrically connected to the gate line and the data line 133. The drain electrode 119 is spaced apart from the source electrode 117.

A passivation layer 125 is formed on the TFT T and includes a drain contact hole 127 exposing the drain electrode 119. The pixel electrode 129 is disposed on the passivation layer 125 and contacts the drain electrode 119 through the drain contact hole 127.

The TFT T including the oxide semiconductor layer 115 has larger mobility as much as several to several hundreds times than the TFT including an amorphous silicon semiconductor layer. For example, when the oxide semiconductor layer is formed of a material of one of zinc oxide, tin oxide, gallium-indium-zinc oxide and indium-tin oxide, each of which has an amorphous structure, doped with one of aluminum (Al), nickel (Ni), copper (Cu), tantalum (Ta), molybdenum (Mo), hafnium (Hf), and titanium (Ti), the TFT including the oxide semiconductor layer has about 20 times mobility in comparison to the TFT including an amorphous silicon semiconductor layer. In addition, the oxide semiconductor layer has high mobility and reliability even if the oxide semiconductor layer is deposited under a relative low temperature.

The gate electrode 110 includes a buffer layer 111, a Cu layer 113 on the buffer layer 111 and a copper nitride (CuN) layer 114 on the Cu layer 113. The buffer layer 111 is formed of one of Mo, Ti and Mo—Ti alloy (MoTi). The Cu layer 113 has a low resistance property and adheres to the buffer layer 111.

The buffer layer 111 of Mo, Ti or MoTi has an excellent adhesive property with the substrate 101 (e.g., glass), while Cu has a bad adhesive property with a glass substrate. Accordingly, an adhesive strength of the Cu layer 113 with the substrate 101 is increased due to the buffer layer 111.

In one embodiment, the first gate insulating layer 121 is formed of silicon nitride, and the second gate insulating layer 123 is formed of silicon oxide. Since silicon nitride has a dielectric constant larger than silicon oxide, the first gate insulating layer 121 of silicon nitride is adequate to improve a storage capacitance of a storage capacitor. On the other hand, since silicon oxide has an insulating property better than silicon nitride, the second insulating layer 123 of silicon oxide is adequate to improve an insulating property. In the present invention, since the gate insulating layer includes the first gate insulating layer 121 of silicon nitride and the second gate insulating layer 123 of silicon oxide, there are advantages in both the storage capacitance and the insulating property due to the gate insulating layer.

Generally, silicon oxide having an excellent insulating property is used as a gate insulating layer. However, when the gate electrode is formed of copper, there is a peeling problem of a silicon oxide layer because the silicon oxide layer has a bad contact or adhesion property with the copper layer. In the present invention, the first gate insulating layer 121 of silicon nitride, which has a good contact or adhesion property with the copper layer 113 as well as the second gate insulating layer 123, is formed between the copper layer 113 and the second gate insulating layer 123, the above problem is mitigated.

In addition, since the first gate insulating layer 121 formed of silicon nitride, which resists diffusion of Cu/CuN (i.e., from the copper nitride layer 114), is disposed between the gate electrode 110, and the second gate insulating layer 123 of silicon oxide, Cu diffusion from the gate electrode 110 to the second gate insulating layer 123 of silicon oxide is mitigated. Therefore, the degeneration of the insulating characteristics (which would be otherwise caused by the diffusion of the Cu ion) of the second gate insulating layer 123 is prevented.

On other hand, Cu is easily oxidized. However, as the first gate insulating layer 121 covers the gate electrode 110, oxidization of the Cu layer 113 of the gate electrode 110 by the oxidized substance from the SiO2 of the second gate insulating layer 123 is prevented.

In the present invention, as mentioned above, the gate electrode 110 includes the copper nitride layer 114 on the Cu layer 113. A plasma treating process using ammonia ($NH_3$) gas, $NH_3$ gas with nitrogen gas, or nitrogen gas is performed on the Cu layer 113 such that crystal grains on a surface of the Cu layer 113 becomes smaller and denser. Namely, by the plasma treating process, copper oxide at a surface of the Cu layer becomes Cu by a reduction, and the copper nitride layer 114 is formed on the Cu layer 113.

Accordingly, each of the gate electrode 110 and the gate line in the present invention has triple layers of Mo/Cu/CuN, Ti/Cu/CuN or MoTi/Cu/CuN. The copper nitride layer 114 covers the Cu layer 113 such that an oxidization problem of the Cu layer 113 is further prevented and a resistance-increasing problem by the oxidization of the Cu layer 113 is prevented.

Moreover, forming copper silicide in the Cu layer 113 is prevented such that a resistance-increasing problem is further prevented. In more detail, as mentioned above, the first gate insulating layer 121 of silicon nitride is formed on the Cu layer 113 to prevent diffusion of Cu ions. In this instance, copper silicide may be formed in the Cu layer 113 by reaction of Cu and silicon nitride. Copper silicide in the Cu layer 113 causes a leakage current problem and a break-down problem of the Cu layer 113.

However, the copper nitride layer 114 is formed on the Cu layer 113 by the plasma treating process such that the reaction of Cu and silicon nitride is prevented. Accordingly, formation of copper silicide in the Cu layer 113 is suppressed.

On the other hand, the first gate insulating layer 121 includes hydrogen ($H_2$) less than 20% such that penetration of oxygen ($O_2$) gas in the air into the first gate insulating layer 121 is prevented. Formation of $H_2O$ by reaction of $H_2$ in the first gate insulating layer 121 with $O_2$ in the air or the second gate insulating layer 123 is minimized. Accordingly, property degradation of the TFT by $H_2O$ is minimized.

Particularly, hydrogen atom may serve as a carrier in the oxide semiconductor layer 115 such that the oxidation layer 115 may be changed into a conductive layer. However, since hydrogen in the first gate insulating layer 121 may be below 20% and the second gate insulating layer 123 is positioned between the first gate insulating layer 121 and the oxide semiconductor layer 115, the above problem is prevented.

In the present invention, since the gate electrode 110 and the gate line are formed of Cu, which has a low resistance property, a signal delay by a signal layer is prevented even if a display device becomes larger. Namely, an image quality degradation resulting from a voltage drop is prevented. In addition, since a width of the signal line can be reduced, an aperture ratio is improved.

Moreover, with the buffer 111 under the Cu layer 113, a peeling problem of the signal line resulting from a bad adhesive strength between the Cu layer 113 and the substrate 101 is prevented. Since the oxidization of the Cu layer is prevented, an electric property degradation of the signal line is also prevented.

Furthermore, since hydrogen in the first gate insulating layer 121 is below 20%, penetration of oxygen ($O_2$) gas in the air into the first gate insulating layer 121 is prevented. As a result, oxidization of the Cu layer 113 by $H_2O$ is prevented and property degradation of the TFT by $H_2O$ is minimized. A problem of changing the oxide semiconductor layer 115 into a conductive layer is prevented.

FIGS. 2A to 2I are cross-sectional views of an array substrate for a flat panel display device according to an embodiment of the present invention. For the sake of explanation, a switching region TrA, where the TFT T is formed, is defined in the pixel region P.

Figure 2A:
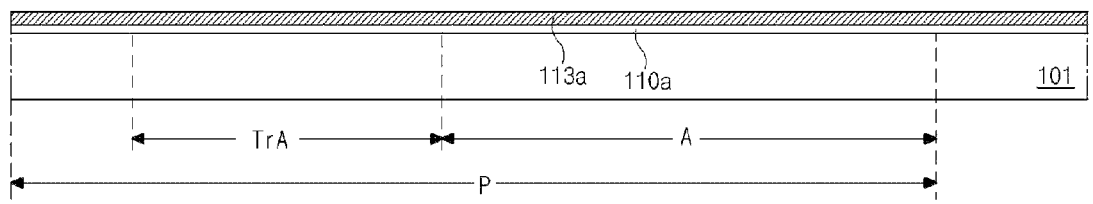
FIGS. 2A through 2I are cross-sectional views of an array substrate for a flat panel display device according to an embodiment of the present invention.

As shown in FIG. 2A, a first metal layer 110a is formed on the substrate of glass 101 by depositing one of Mo, Ti and MoTi, and a second metal layer 113a is formed on the first metal layer 110a by depositing Cu. When the second metal layer of Cu is directly deposited on the substrate, there is a peeling problem resulting from a bad contact or adhesion property between the Cu layer and the substrate. However, the first layer 110a of Mo or MoTi has a good contact or adhesion property with both the substrate 101 and the second layer 113a of Cu, the peeling problem resulting from the bad contact or adhesion property between the substrate 101 and the second metal layer 113a of Cu is prevented.

Figure 2B:
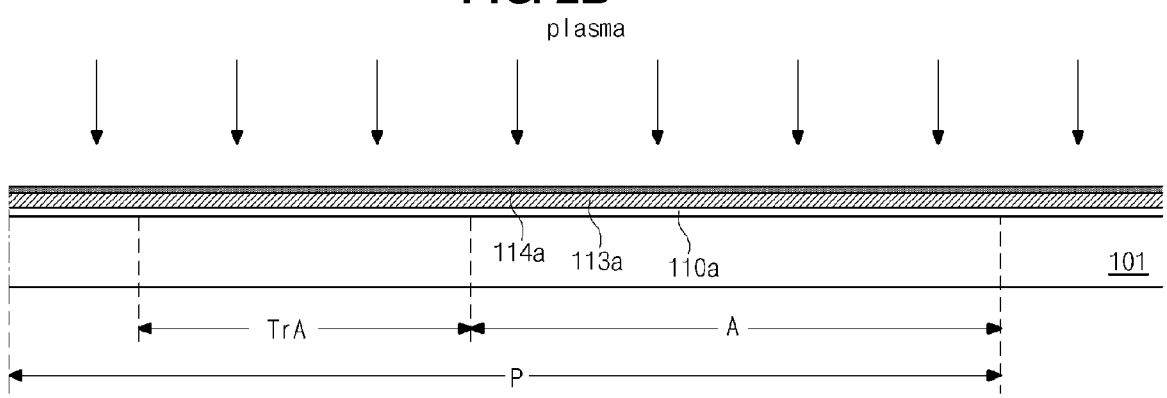

Next, as shown in FIG. 2B, the substrate 101, where the first and second metal layers 110a and 113a are formed, is disposed in a plasma process chamber (not shown), a plasma process is conducted on the second metal layer 113a with an ammonium gas, an ammonium gas with a nitrogen gas, or a nitrogen gas. For example, with a mixture gas of ammonium gas and the nitrogen gas, a copper nitride material layer 114a is formed on the second metal layer 113a without damages on a surface of the second metal layer 113a.

In this instance, the plasma process is performed in the chamber having the degree of a vacuum of about 80 to 120 millitorr (mTorr) with a power of about 800 to 1000 Watts (W). The ammonium gas at the rate of about 50 to 5000 standard cubic centimeter per minute (sccm) and the nitrogen gas at the rate of about 10 to 5000 sccm are flown into the chamber. A plasma state may be maintained for about 1 to 100 seconds in the chamber.

In another example using the mixture gas of the ammonium gas and the nitrogen gas, the plasma process is performed in the chamber having the degree of a vacuum of about 80 to 120 mTorr with a power of about 5 k to 15 kW. The ammonium gas at the rate of about 15000 to 30000 sccm and the nitrogen gas at the rate of about 35000 to 45000 sccm are flown into the chamber. A plasma state may be maintained for about 5 to 100 seconds in the chamber.

As mentioned above, the plasma process with the nitrogen gas only can be conducted on the substrate 101 on which the second metal layer 113a is formed. For example, the plasma process is performed in the chamber having the degree of a vacuum of about 80 to 120 mTorr with a power of about 1 k to 5 kW. The nitrogen gas at the rate of about 20000 to 40000 sccm is flown into the chamber. A plasma state may be maintained for about 5 to 100 seconds in the chamber. With the plasma process using the nitrogen gas, $H_2$ in the CuN layer 114 can be reduced or removed.

By the above plasma process, the copper nitride material layer 114a is formed on the second metal layer 113a such that an oxidization of the second metal layer 113a is prevented. Namely, the copper nitride layer 114a serves as a protection layer of the second metal layer 113a.

Figure 2C:
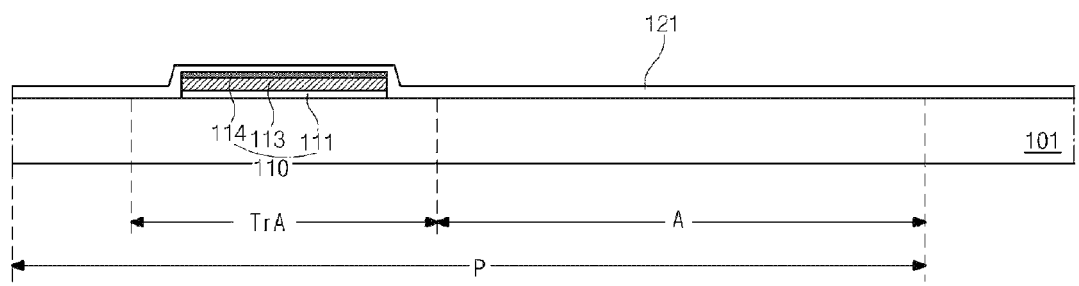

Next, as shown in FIG. 2C, a first mask process, which includes a step of forming a photoresist (PR) layer, a step of exposing the PR layer using an exposing mask, a step of developing the exposed PR layer to form a PR pattern, a step of etching a layer using the PR pattern as an etching mask and a step of stripping or ashing the PR pattern, is performed to pattern the copper nitride material layer 114a, the second metal layer 113a and the first metal layer 110a. As a result, the gate line (not shown) and the gate electrode 110, each of which includes the buffer layer 111, the Cu layer 113 and the copper nitride layer 114, are formed on the substrate 101. The gate line extends along a direction. The gate electrode 110 is connected to the gate line and positioned in the switching region TrA.

FIGS. 2B and 2C show the layers 110a, 113a and 114a are patterned after the plasma process is performed. Alternatively, the layers 110a and 113a may be patterned before the plasma process. In this instance, the copper nitride layer is formed at a side surface as well as a top surface of the Cu layer 113 such that a diffusion of copper ion from the Cu layer 113 into the second gate insulating layer 123 (of FIG. 2D) is further prevented. Accordingly, a reaction of Cu in the copper layer 113 with silicon nitride in the first gate insulating layer 121 is further prevented.

Next, the first gate insulating layer 121 is formed on the gate line and the gate electrode 110 by depositing silicon nitride. The first gate insulating layer 121 is formed by a chemical vapor deposition (CVE) using a nitrogen gas and a silane ($SiH_4$) gas. For example, the first gate insulating layer 121 is deposited in the chamber having the degree of a vacuum of about 80 to 120 mTorr with a power of about 1500 to 1700 W. The nitrogen gas at the rate of about 600 to 800 sccm and the silane gas at the rate of about 130 to 150 sccm are flown into the chamber.

Since the first gate insulating layer 121 is deposited using the nitrogen gas and the silane gas, a weight % of hydrogen in the first gate insulating layer 121 may be less than 20%. Accordingly, penetration of oxygen gas in the air into the first gate insulating layer 121 is prevented, and an oxidization problem of the Cu layer 113 by moisture is also prevented.

On the other hand, when the first gate insulating layer of silicon nitride is directly formed on the Cu layer, copper silicide may be formed in the Cu layer by reaction of copper and silicon nitride. However, since the copper nitride layer 114 is formed on a surface of the Cu layer 113 by the above plasma process, a reaction of Cu in the Cu layer 113 and silicon nitride in the first gate insulating layer 121 is prevented due to the copper nitride layer 114. Namely, the copper nitride layer 114 serves as a diffusion-prevention layer of the Cu layer 113.

The first gate insulating layer 121 has a thickness of about 50 to 4000 angstroms. The silicon nitride layer has a relatively high dielectric constant. Accordingly, considering a storage capacitance, the thickness of the first gate insulating layer 121 can be controlled to be lowered.

Figure 2D:
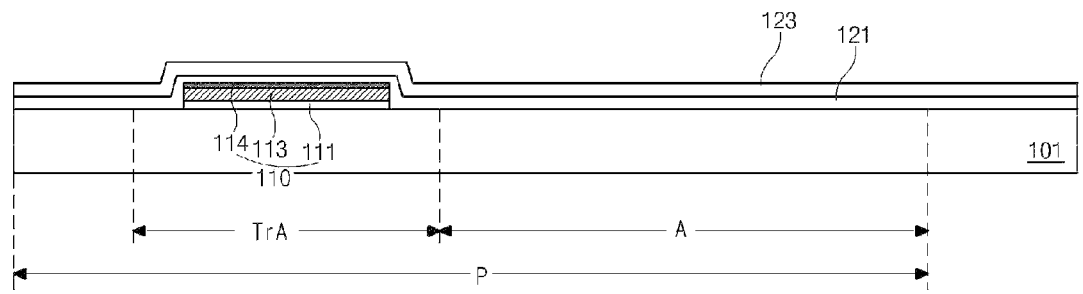

Next, as shown in FIG. 2D, the second gate insulating layer 123 is formed on the first gate insulating layer 121 by depositing silicon oxide. For example, the second gate insulating layer 123 may have a thickness of about 500 to 4000 angstroms to be larger than the thickness of the first gate insulating layer 121.

Since the gate line and the gate electrode 110 does not contact the second gate insulating layer 123 due to the first gate insulating layer 121, a diffusion of copper ions into the second gate insulating layer 123 is prevented. In addition, the copper layer 113 does not contact the second gate insulating layer 123, an oxidization of copper by oxide in the second gate insulating layer is further prevented.

Figure 2E:
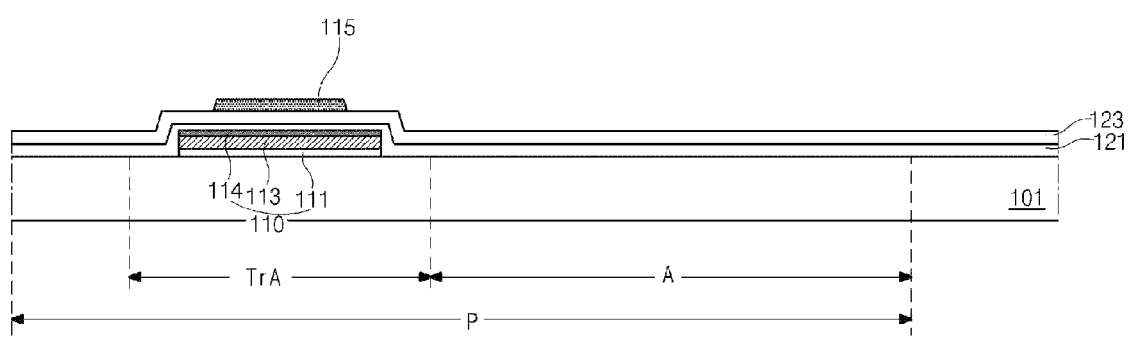

Next, as shown in FIG. 2E, an oxide semiconductor layer (not shown) is deposited on the second gate insulating layer 123 by a sputtering method and patterned to the oxide semiconductor layer 115 having an island shape in the switching region TrA. The oxide semiconductor layer 115 corresponds to the gate electrode 110. As mentioned above, the oxide semiconductor layer 115 is formed of one of zinc oxide, tin oxide, gallium-indium-zinc oxide and indium-tin oxide doped with one of aluminum (Al), nickel (Ni), copper (Cu), tantalum (Ta), molybdenum (Mo), hafnium (Hf), and titanium (Ti).

When the oxide semiconductor layer 115 is directly formed on the first gate insulating layer 121 of silicon nitride without the second semiconductor layer 123, the oxide semiconductor material in the oxide semiconductor layer 115 can be changed to have a conductive property by hydrogen atom. However, since hydrogen in the first gate insulating layer 121 may be held below about 20 weight % and a diffusion of hydrogen atom into the oxide semiconductor layer 115 is blocked by the second gate insulating layer 123, the problem is prevented.

Figure 2F:
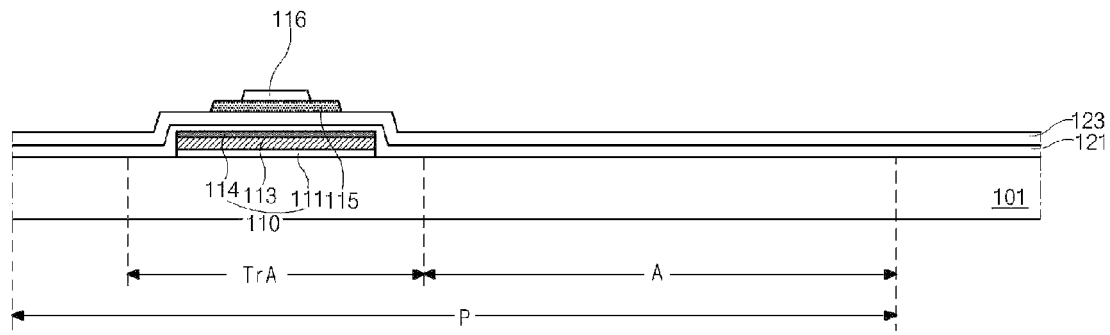

Next, as shown in FIG. 2F, an inorganic insulating material layer (not shown) is formed on the oxide semiconductor layer 115 and patterned to form the etch-stopper 116.

Figure 2G:
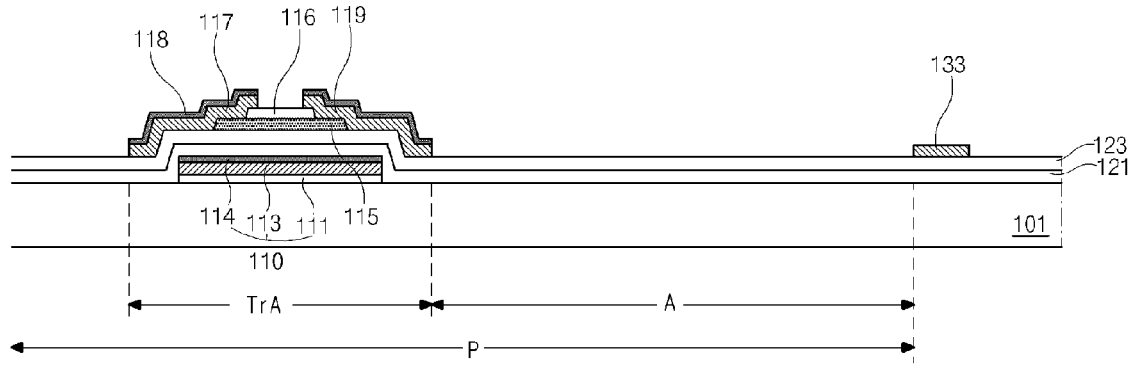

Next, as shown in FIG. 2G, a third metal layer (not shown) is formed on the etch-stopper 116 by depositing at least one of aluminum (Al), Al alloy, copper (Cu), copper alloy, molybdenum (Mo) and chromium (Cr). The third metal layer is patterned to form the data line 133, the source electrode 117 and the drain electrode 119. The data line 133 crosses the gate line to define the pixel region P and is connected to the source electrode 117. The source and drain electrodes 117 and 119 are positioned in the switching region TrA and spaced apart from each other.

Since the oxide semiconductor layer 115 is covered with the etch-stopper 116, there is no damage on the oxide semiconductor layer 115 during an etching process of the source and drain electrodes 117 and 119.

Figure 2H:
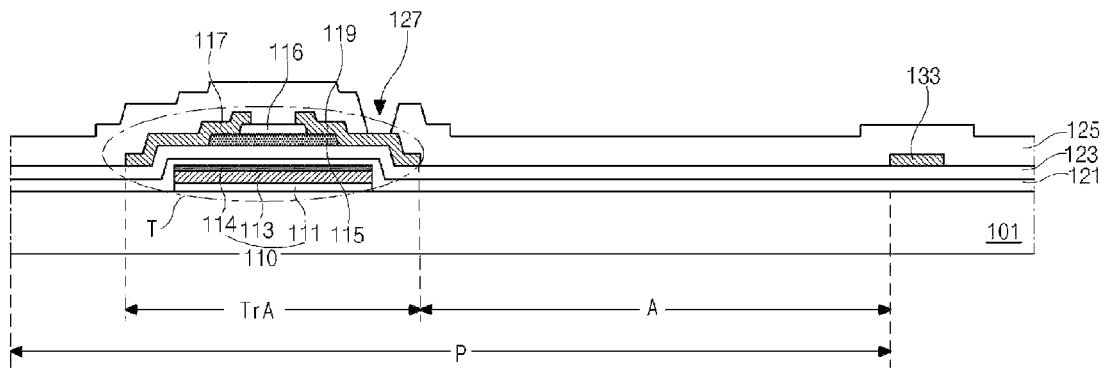

Next, as shown in FIG. 2H, the passivation layer 125 is formed on the source and drain electrodes 117 and 119 and the data line 133 by depositing an inorganic insulating material, e.g., silicon oxide or silicon nitride, or coating an organic insulating material, e.g., benzocyclobutene (BC) or photoacryl. The passivation layer 125 is patterned to form a drain contact hole 127 exposing the drain electrode 119.

Figure 2I:
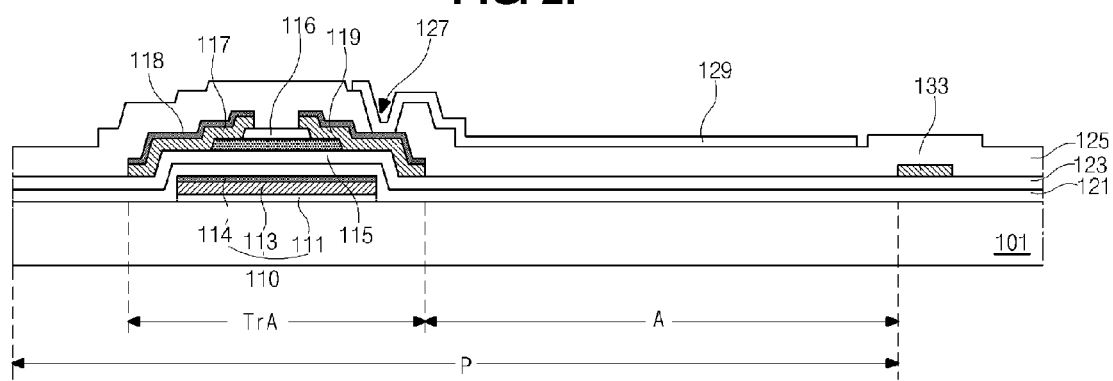

Next, as shown in FIG. 2I, a transparent conductive material layer (not shown) is formed on the passivation layer 125 by depositing a transparent conductive material, e.g., indium-tin-oxide (ITO) or indium-zinc-oxide (IZO). The transparent conductive material layer is patterned to form the pixel electrode 129 in the pixel region P. The pixel electrode 129 contacts the drain electrode 119 through the drain contact hole 127.

Figure 3:
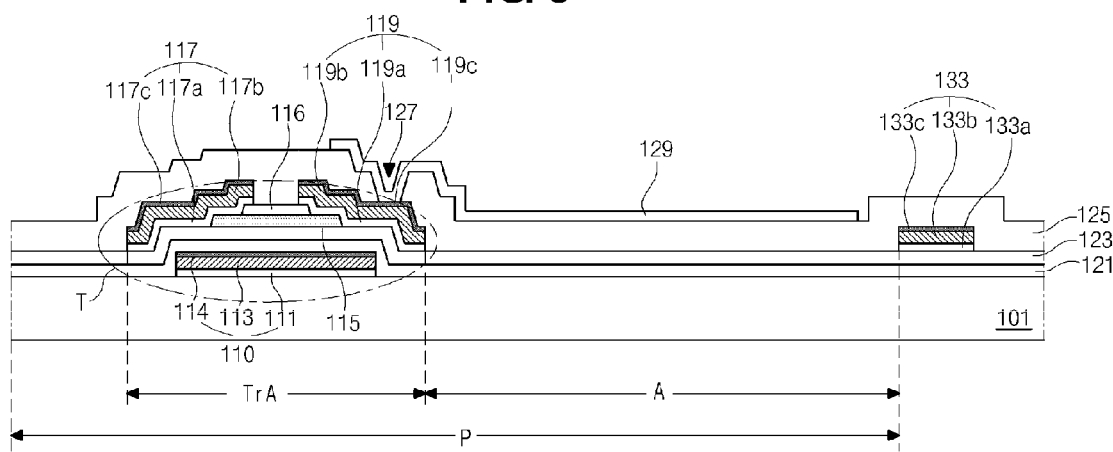
FIG. 3 is a cross-sectional view of an array substrate including a thin film transistor for a flat panel display device according to an embodiment of the present invention.

On the other hand, to reduce a resistance of the source and drain electrode 117 and 119 and the data line 133, each of the source drain electrode 117 and 119 and the data line 133 includes a layer of copper. In this instance, as show in FIG. 3, the source and drain electrode 117 and 119 and the data line 133 include first layers 117a, 119a and 133a of Mo, Ti or MoTi, second layers 117b, 119b and 133b of Cu and third layers 117c, 119c and 133c of copper nitride, respectively. Namely, the source and drain electrode 117 and 119 and the data line 133 have similar structure with the gate electrode 110 and the gate line.

Due to the first layers 117a, 119a and 133a, a diffusion of copper ions into the second gate insulating layer 123 of silicon oxide is prevented. On the other hand, when the passivation layer 125 is formed of silicon oxide, an oxidization problem of copper in the second layers 117b, 119b and 133b is prevented due to the third layers 117c, 119c and 133c. When copper is oxidized, resistance and stress of the Cu line is increased such that electrical properties of the Cu line are degraded. However, these problems are not occurred by the above structure. In addition, when the passivation layer 125 is formed of silicon nitride on the source and drain electrode 117 and 119 and the data line 133 without the third layers 117c, 119c and 133c, copper silicide may be formed in the second layers 117b, 119b and 133b of copper by reaction of copper and silicon nitride. However, the third layers 117c, 119c and 133c of copper nitride are formed on the second layers 117b, 119b and 133b by the plasma treating process such that the reaction of copper and silicon nitride is prevented. Accordingly, formation of copper silicide in the second layers 117b, 119b and 133b is suppressed.

In addition, when the passivation layer 125 is formed of silicon nitride, hydrogen atom in the passivation layer easily reacts with oxygen atom in the air to form moisture. In this instance, copper is easily oxidized by moisture. However, since the third layers 117c, 119c and 133c are positioned between the passivation layer 125 and each of the second layers 117b, 119b and 133b, the oxidization of copper in the second layers 117b, 119b and 133b is prevented.

Figure 4:
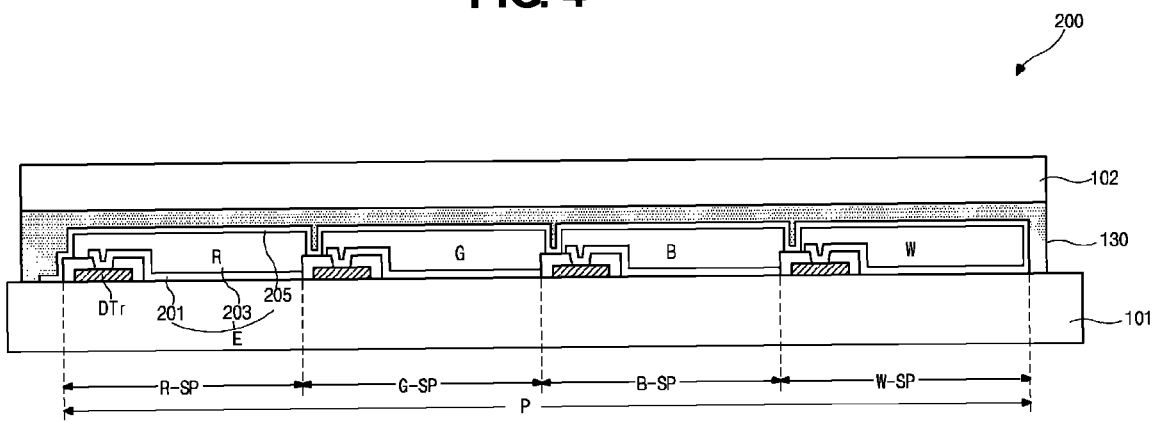
FIG. 4 is a cross-sectional view of an organic light emitting diode device according to an embodiment of the present invention.
Figure 5:
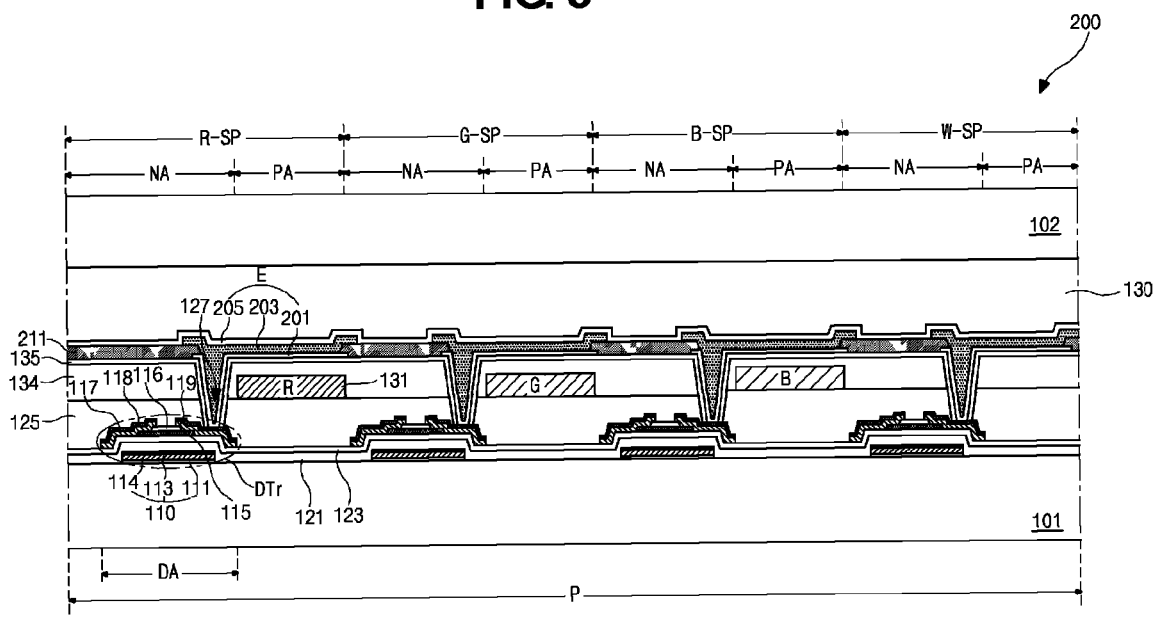
FIG. 5 is an enlarged cross-sectional view of a portion of an organic light emitting diode device in FIG. 4.

FIG. 4 is a cross-sectional view of an organic light emitting diode device according to an embodiment of the present invention, and FIG. 5 is an enlarged cross-sectional view of a portion of an organic light emitting diode device in FIG. 4.

Among the flat panel display devices, an organic electroluminescent display (OELD) device is a self-emitting type and does not require a backlight unit. As a result, the OELD device has low weight and low power consumption. In addition, The OELD device has excellent characteristics of a view angel, a contrast ratio, a response time and so on. Particularly, the OELD device is fabricated by simpler processes, the OELD device has a low production cost. Recently, a flexible OELD device is introduced.

The OELD device is classified into a top emission type and a bottom emission type depending on a light transmission direction. The embodiment is explained with the bottom emission type OELD device.

Referring to FIGS. 4 and 5, the OELD device 200 includes a base substrate 101, an emitting diode E and an encapsulation substrate 102. On the base substrate 101, a driving TFT DTr, a switching TFT (not shown) and the emitting diode E are formed.

In the OELD device 200, one pixel region P is divided into a plurality of sub-pixels SP. In each sub-pixel SP, a driving region DA for the driving TFT DTr, a non-display region NA, an emitting region PA for a color filter 131 are defined.

The driving TFT DTr, which is formed in the driving region of each sub-pixel SP, includes the gate electrode 110, the first and second gate insulating layers 121 and 123, the oxide semiconductor layer 115, the source electrode 117 and the drain electrode 119. Although not shown, the gate line and the data line respectively extend along boundaries of the sub-pixel SP, and the switching TFT has similar structure with the driving TFT DTr. The switching TFT is connected to the gate and data lines and the driving TFT DTr.

The driving TFT DTr further includes the etch-stopper 116 for preventing for the oxide semiconductor layer 115 from being exposed to an etchant for patterning the source electrode 117 and the drain electrode 119.

The driving TFT DTr including the oxide semiconductor layer 115 has larger mobility as much as several to several hundreds times than the driving TFT DTr including an amorphous silicon semiconductor layer. For example, when the oxide semiconductor layer is formed of a material of one of zinc oxide, tin oxide, gallium-indium-zinc oxide and indium-tin oxide, each of which has an amorphous structure, doped with one of aluminum (Al), nickel (Ni), copper (Cu), tantalum (Ta), molybdenum (Mo), hafnium (Hf), and titanium (Ti), the driving TFT DTr including the oxide semiconductor layer has about 20 times mobility in comparison to the TFT including an amorphous silicon semiconductor layer. In addition, the oxide semiconductor layer has high mobility and reliability even if the oxide semiconductor layer is deposited under a relative low temperature.

The gate electrode 110 includes a buffer layer 111, a Cu layer 113 on the buffer layer 111 and a copper nitride (CuN) layer 114 on the Cu layer 113. The buffer layer 111 is formed of one of Mo, Ti and Mo—Ti alloy (MoTi). The Cu layer 113 has a low resistance property.

The buffer layer 111 of Mo, Ti or MoTi has an excellent adhesive property with the substrate 101 of glass, while Cu has poor adhesive property with a glass substrate. Accordingly, an adhesive strength of the Cu layer 113 with the substrate 101 is increased due to the buffer layer 111.

The first gate insulating layer 121 is formed of silicon nitride, and the second gate insulating layer 123 is formed of silicon oxide. Since silicon nitride has a dielectric constant larger than silicon oxide, the first gate insulating layer 121 of silicon nitride is adequate to improve a storage capacitance of a storage capacitor. On the other hand, since silicon oxide has an insulating property better than silicon nitride, the second insulating layer 123 of silicon oxide is adequate to improve an insulating property. In the present invention, since the gate insulating layer includes the first gate insulating layer 121 of silicon nitride and the second gate insulating layer 123 of silicon oxide, there are advantages in both the storage capacitance and the insulating property due to the gate insulating layer.

In addition, since the first gate insulating layer 121 formed of silicon nitride, which resists diffusion of Cu/CuN (i.e., from the copper nitride layer 114), is disposed between the gate electrode 110, and the second gate insulating layer 123 of silicon oxide, Cu diffusion from the gate electrode 110 to the second gate insulating layer 123 of silicon oxide is mitigated. The silicon oxide layer is easily damaged by Cu ions. However, the first gate insulating layer 121 serves as a barrier of Cu ion diffusion, there is no damage on the second gate insulating layer 123 by Cu ions.

On other hand, Cu is easily oxidized. However, as the first gate insulating layer 121 covers the gate electrode 110, oxidization of the Cu layer 113 of the gate electrode 110 is prevented.

In the present invention, as mentioned above, the gate electrode 110 includes the copper nitride layer 114 on the Cu layer 113. A plasma treating process using ammonia (NH$_3$) gas or NH$_3$ gas with nitrogen gas is performed on the Cu layer 113 such that crystal grains on a surface of the Cu layer 113 becomes smaller and denser. Namely, by the plasma treating process, copper oxide at a surface of the Cu layer becomes Cu by a reduction, and the copper nitride layer 114 is formed on the Cu layer 113.

Accordingly, each of the gate electrode 110 and the gate line in the present invention has triple layers of Mo/Cu/CuN, Ti/Cu/CuN or MoTi/Cu/CuN. The copper nitride layer 114 covers the Cu layer 113 such that an oxidization problem of the Cu layer 113 is further prevented and a resistance-increasing problem by the oxidization of the Cu layer 113 is prevented.

Moreover, forming copper silicide in the Cu layer 113 is prevented such that a resistance-increasing problem is further prevented. In more detail, as mentioned above, the first gate insulating layer 121 of silicon nitride is formed on the Cu layer 113 to prevent diffusion of Cu ions. In this instance, copper silicide may be formed in the Cu layer 113 by reaction of Cu and silicon nitride. Copper silicide in the Cu layer 113 causes a leakage current problem and a break-down problem of the Cu layer 113. However, the copper nitride layer 114 is formed on the Cu layer 113 by the plasma treating process such that the reaction of Cu and silicon nitride is prevented. Accordingly, formation of copper silicide in the Cu layer 113 is suppressed.

On the other hand, the first gate insulating layer 121 includes hydrogen ($H_2$) less than 20% such that penetration of oxygen ($O_2$) gas in the air into the first gate insulating layer 121 is prevented. Formation of $H_2O$ by reaction of $H_2$ in the first gate insulating layer 121 with $O_2$ in the air or the second gate insulating layer 123 is minimized. Accordingly, property degradation of the driving TFT DTr by $H_2O$ is minimized.

Particularly, hydrogen atom may serve as a carrier in the oxide semiconductor layer 115 such that the oxidation layer 115 may be changed into a conductive layer. However, since hydrogen in the first gate insulating layer 121 may be below 20% and the second gate insulating layer 123 is positioned between the first gate insulating layer 121 and the oxide semiconductor layer 115, the above problem is prevented.

The passivation layer 125 is formed on the driving TFT DTr, and the color filter 131 including red, green and blue color filter patterns R, G and B is formed on the passivation layer 125 and in the emitting region PA of each of red, green and blue sub-pixels R-SP, G-SP and B-SP. Accordingly, the OELD device 200 can provide a full-color image.

To provide high brightness white light, the OELD device 200 may further include a white sub-pixel W-SP. Namely, in the OELD device 200, red, green, blue and white sub-pixels R-SP, G-SP, B-SP and W-SP constitute one pixel P. In this instance, since an emitting diode E of the white sub-pixel W-SP emits white light, a color filter pattern in the white sub-pixel W-SP may be omitted.

An overcoat layer 134 is formed on the color filter 131. The overcoat layer 134 provides a flat top surface and serves as a protector of the color filter 131.

An optical path control layer 135 is formed on the overcoat layer 134. Due to the optical path control layer 135, the OEDL device 200 has a micro-cavity effect. To reduce a reflection problem by the optical path control layer 135, the optical path control layer 135 is formed of a material having similar refractive index with a material of an organic emitting layer 203 of the emitting diode E. For example, the material of the optical path control layer 135 has a refractive index of about 1.6 to 2.4 in a visible ray wavelength band. In addition, to minimize light loss by the optical path control layer 135, the optical path control layer 135 has a light transmittance above about 90% in a visible ray wavelength band. For example, the optical path control layer 135 may be formed of silicon nitride and has a hydrogen weight % below about 20. Accordingly, penetration of oxygen ($O_2$) gas in the air into the optical path control layer 135 is prevented, and formation of $H_2O$ by reaction of $H_2$ in the optical path control layer 135 with $O_2$ is minimized. Accordingly, property degradation of the emitting diode E by $H_2O$ or $O_2$ is minimized.

In more detail, the property, e.g., a life-time, of the emitting diode E is degraded by $H_2O$ or $O_2$. However, by decreasing the weight % of hydrogen in the optical path control layer 135, property degradation of the emitting diode E by $H_2O$ or $O_2$ is minimized.

The optical path control layer 135, the overcoat layer 134 and the passivation layer 125 includes a drain contact hole 127 exposing the drain electrode 119 of the driving TFT DTr.

On the optical path control layer 135, a first electrode 201, the organic emitting layer 203 and the second electrode 205 are formed. The first electrode 201, the organic emitting layer 203 and the second electrode 205 constitute the emitting diode E.

The first electrode 201 contacts the drain electrode 119 of the driving TFT DTr through the drain contact hole 127 and is separated from those in other sub-pixels SP.

In addition, a bank 211 is formed in the non-display region NA between adjacent first electrode 201. Namely, the bank 211 has a lattice shape such that the first electrode 201 in adjacent sub-pixel SP is separated by the bank 211.

For example, the first electrode 201 may be formed of a high work function material to serve as an anode. The first electrode 201 may be formed of ITO. In addition, the second electrode 205 may be formed of a low work function material to serve as a cathode. The second electrode 205 may be formed of Al or Al alloy.

The organic emitting layer 203 is disposed between the first and second electrodes 201 and 205. The light from the organic emitting layer 203 passes through the first electrode 201.

The organic emitting layer 203 has a single layer of an emitting material layer. Alternatively, to improve an emitting efficiency, the organic emitting layer 203 may have multi layers of a hole-injection layer, a hole transporting layer, an emitting material layer, an electron transporting layer and an electron injection layer.

When voltages are applied to the first and second electrodes 201 and 205, a hole from the first electrode 201 and an electron from the second electrode 205 are transported into the organic emitting layer 203 to form an exiton. The exiton transits from an exciting state into a ground state such that light is emitted from the organic emitting layer 203. The light passes through the first electrode 201 and the base substrate 101 such that the OELD device 200 provide an image.

The encapsulation substrate 102 is attached onto the emitting diode E using an adhesion layer 130 such that the OELD device 200 is encapsulated.

As mentioned above, in the OELD device 200 of the present invention, the gate electrode and the gate line are formed of Cu, which has a low resistance property, a signal delay by a signal layer is prevented even if a display device becomes larger. Namely, an image quality degradation resulting from a voltage drop is prevented. In addition, since a width of the signal line can be reduced, an aperture ratio is improved.

Moreover, with the buffer under the Cu layer, a peeling problem of the signal line resulting from a bad adhesive strength between the Cu layer and the base substrate is prevented. Since the oxidization of the Cu layer is prevented, an electric property degradation of the signal line is also prevented.

Furthermore, since hydrogen in the first gate insulating layer is below 20%, penetration of oxygen ($O_2$) gas in the air into the first gate insulating layer is prevented. As a result, oxidization of the Cu layer by H2O is prevented and property degradation of the driving TFT by $H_2O$ is minimized. A problem of changing the oxide semiconductor layer into a conductive layer is prevented.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A thin film transistor, comprising:
a gate electrode on a substrate, wherein the gate electrode includes a first layer formed of copper and a second layer formed of copper nitride on the first layer;
a gate insulating layer including a first gate insulating layer formed of silicon nitride and a second gate insulating layer formed of silicon oxide, wherein the first gate insulating layer is disposed on and contacts the gate electrode, and the second gate insulating layer is disposed on the first gate insulating layer;
a semiconductor layer formed of an oxide semiconductor material on the second gate insulating layer;
an etch-stopper layer formed on the semiconductor layer; and
a source electrode and a drain electrode formed on the etch-stopper layer and spaced apart from each other.

2. The thin film transistor of claim 1, wherein the first gate insulating layer includes hydrogen by less than 20 weight percentage (%).

3. The thin film transistor of claim 1, wherein the gate electrode further includes a third layer disposed between the substrate and the first layer and formed of one of molybdenum, titanium and molybdenum-titanium alloy.

4. A thin film transistor (TFT) array substrate comprising:
a gate electrode on a substrate, wherein the gate electrode includes a first layer formed of copper and a second layer formed of copper nitride on the first layer;
a first gate insulating layer on the substrate including the gate electrode and formed of silicon nitride, the first gate insulating layer contacting the gate electrode;
a second gate insulating layer on the first gate insulating layer and formed of silicon oxide;
a semiconductor layer formed of an oxide semiconductor material on the second gate insulating layer;
an etch-stopper layer formed on the semiconductor layer;
a source electrode and a drain electrode formed on the etch-stopper layer and spaced apart from each other;
a gate line coupled to the gate electrode;
a data line on the second gate insulating layer and coupled to the source electrode; and
a pixel electrode coupled to the drain electrode,
wherein the first gate insulating layer includes hydrogen by less than 20 weight percentage (%).

5. The TFT array substrate of claim 4, further comprising a passivation layer on the source electrode, the drain electrode and the data line and including a drain contact hole exposing the drain electrode, wherein the pixel electrode is disposed on the passivation layer and contact the drain electrode through the drain contact hole.

6. The TFT array substrate of claim 5, wherein each of the source electrode, the drain electrode and the data line includes a third layer of one of molybdenum, titanium and molybdenum-titanium alloy, a fourth layer of copper and a fifth layer of copper nitride, and the fourth layer is disposed between the first and third layers, and wherein the passivation layer is formed of silicon oxide or silicon nitride.

* * * * *